United States Patent [19]

Smith et al.

[11] 4,410,832
[45] Oct. 18, 1983

[54] EBS DEVICE WITH COLD-CATHODE

[75] Inventors: Bernard Smith, Ocean; Stanley Dubuske, Lincroft, both of N.J.

[73] Assignee: The United States of America as represented by the Secretary of the Army, Washington, D.C.

[21] Appl. No.: 461,291

[22] Filed: Jan. 27, 1983

Related U.S. Application Data

[63] Continuation of Ser. No. 216,588, Dec. 15, 1980.

[51] Int. Cl.³ .................... H01J 23/16; H01J 29/96
[52] U.S. Cl. ...................................... 315/3; 313/302; 313/336; 313/366
[58] Field of Search ............... 315/3; 313/309, 302, 313/336, 366, 367

[56] References Cited

U.S. PATENT DOCUMENTS

| 2,537,388 | 1/1951 | Wooldridge | 313/336 |
| 2,982,147 | 5/1961 | Redman | 313/309 |
| 3,803,510 | 4/1974 | Nicoll | 313/336 |
| 3,891,887 | 6/1975 | Barry et al. | 315/3 |
| 3,916,255 | 10/1975 | Crandall | 315/3 |
| 4,008,412 | 2/1977 | Yuito et al. | 313/309 |
| 4,160,188 | 7/1979 | Butterwick | 313/366 |
| 4,178,531 | 12/1979 | Alig | 313/309 |

Primary Examiner—Saxfield Chatmon
Attorney, Agent, or Firm—Robert P. Gibson; Jeremiah G. Murray; Michael C. Sachs

[57] ABSTRACT

Apparatus and method are described for fabricating a long life cold cathode electron beam semiconductor device (EBS). Fabrication is given of a vacuum tube structure capable of sustaining sufficiently high vacuum over extended time to prevent poisoning of the cold cathode and steps are give for growth of a plural tip cold cathode structure.

4 Claims, 4 Drawing Figures

EBS DEVICE WITH COLD-CATHODE

The invention described herein may be made for or by the Government for governmental purposes without the payment of royalties thereon or therefor.

This application is a continuation of application Ser. No. 216,588, filed Dec. 15, 1980.

BACKGROUND OF THE INVENTION

Production of an EBS Device (Electron Beam Semiconductor Device) with cold cathode instead of conventional hot cathode has hitherto been considered impractical. It had been experienced that a cold cathode in such conditions would rapidly be poisoned by its environment. This was due to inability to maintain sufficiently high to very high vacuua (from $10^{-7}$ Torr to $10^{-8}$ Torr) within the vacuum tube. This vacuum problem is due to degassing of the interior components of the device, and the very walls of the vacuum envelope itself in such very high vaccua. Once poisoned by such atmosphere, the energy required for sustained emission of cold cathode, given by the emission equation, increases drastically; before long the cold cathode is entirely inoperational. The life span of such a device would be quite short as a result so as to render it impractical. The conventional hot cathode EBS device itself only has a maximum life span of some 20,000 hours. Avoiding the necessity of attaching appendage pumps to maintain a vacuum and numerous other inherent failure mechanisms would also be greatly desirable. To date, however, the hot cathode type EBS amplifier has been the only real choice known.

Development of a cold-cathode EBS device would be of obvious great advantage. The life-span of such a solid-state device would theoretically be unlimited; a cold cathode device would operate at room temperature, which would eliminate the requirement of a filament power supply. A cold cathode device would be lighter weight, making it thereby ideally suited for airborne and space applications.

In solving the vacuum problem, the appendage pumps needed for the conventional hot cathode device would be eliminated as well. This last simplification would even further lower the costs of production and operation which reduction would be possible because of the above cited advantages.

BRIEF DESCRIPTION OF THE INVENTION

The cold cathode EBS device is fabricated through solution of several problem factors which have plagued fabrication and application of such devices until now. Judicious choice of materials to be employed within the vacuum tube and careful preprocessing of all materials before assembly have significantly minimized the effect of the above mentioned undesirable factors. Considered most important in this regard is identification of getters for use within the vacuum envelope, which getters will not degass in a rarefied vacuum as is common, thereby fouling the environment and especially the cathode emitter. Next in importance is a careful choice of materials which by their nature are least likely to degass in vacuum, yet which meet the other important standards in regard to performance under heat, expansion rates, degree of fragility and costs for instance. A further important step of the fabrication technique to be described in detail below is the chemical cleaning and prefiring of most of the materials before assembly to remove volatile surface matter. These techniques further take into account selection of proper materials in regard to matters of heat expansion, propensity to degass or poison, and best emission qualities, among other matters considered. Moreover, those select materials which alone were found most suitable for use as low threshold cold cathode emitter material have been identified and employed. A fabrication technique for growth of metal semiconductor cold cathode tips which involves growth of tips with accompanying grid structure for the EBS embodiment has also been developed and employed.

OBJECTS OF THE INVENTION

Accordingly, one object of this invention is to provide an EBS amplifier device with cold cathode versus hot cathoe emitter.

Another object of this invention is the provision of fabrication techniques which would enable a sufficiently high vacuum to be realized in an operating sealed-off vacuum device.

LIST OF FIGURES

DETAILED DESCRIPTION OF THE INVENTION

Figure 1:
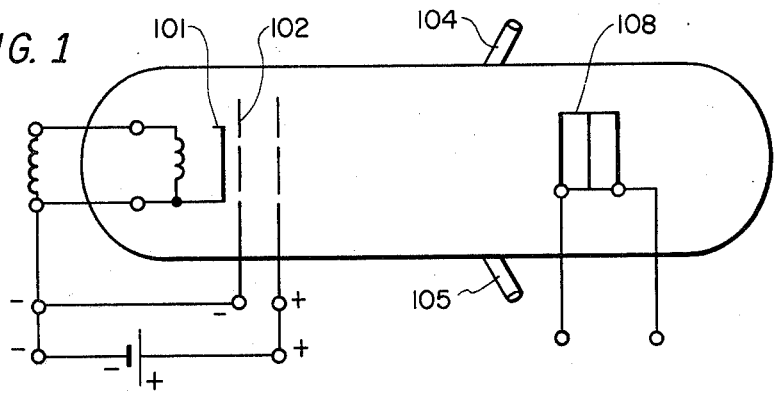
FIG. 1 illustrates a conventional hot cathode EBS device.

FIG. 1 illustrates a conventional hot cathode EBS device as point of reference. As is known to those skilled in the art, electrons from the hot cathode source 101 bombard the target EBIT device 108. The present commercially available EBIT (Electron Beam Injected Target) devices individually provide amplification of as much as 2,000 fold energy for every electron which bombards it at sufficient energy greater than threshold, approximately 6000 volts. A signal to be amplified may be fed to Anode 101, for instance, modulated by a first grid 102 in conventional triode or tetrode fashion with additional grids for amplification purposes. The grids have the function, amongst others, of directing and modulating beams inroute to the EBIT target.

The conventional hot cathode device in FIG. 1 has many significant disadvantages contributing to its relatively short life span and undue complexity. Most significant in short life span is the eventual poisoning of the EBIT device by increasingly poisoned atmosphere within the envelope; such poisoning being traceable to at least the following factors. First, getters conventionally used in such vacuum devices when activated, explode and evaporate in that rarefied vacuum environment. As known in the art, a getter is an amount of porous material used to absorb and collect stray gas molecules, and are necessary in preserving vacuums in such devices. Unfortunately, when the conventional getters are evaporated, the structural elements near the getter are coated with deposits, such as barium. These contaminants degrade a device such as the EBIT, and adversely affect the life of the hot cathode EBS device. In the case of the cold cathode device, these contaminants, additionally, would immediately degrade the cold cathode in addition to the EBIT, further limiting the life of an EBS device and making its construction with a cold cathode unfeasible. As will be pointed out later, those getters which will not explode under these operating conditions have been identified for use in such cold cathode applications. A next factor which causes poisoning of the atmosphere is degassing of the interior walls of the vacuum tube envelope itself. This is a distinct probability in the very high vacuums used here, $10-7$ to $10-8$ Torr, e.g. All elements within the vacuum envelope are candidates for degassing and must be examined, such as the cathode grid structure and the EBIT at high enough temperatures and vacuum. Even the insulation on the filament heater wires in hot cathode devices had been found to crack, explode or degass in the conventional heat and vacuum environment, leading to voltage breakdown due to leakage paths from the filament to the hot cathode. In the vacuum of this cold cathode invention, a vacuum as high as $10-8$ Torr is successfully achieved, and degassing effects successfully overcome.

Noteworthy in FIG. 1 is the added complexity of providing appendage pumps represented there by tubes at 104 and 105. In the conventional device the pumps are continually operated in an attempt to sustain the vacuum sufficiently rare, this despite the use of added getters. In the structure of this invention represented in FIG. 2 for instance, these pumps are dispensed with. The complexity of filament wires and accompanying transformer circuitry for the heater voltages of the cathode of the conventional EBS, and other failure mechanisms inherent are also eliminated with the cold cathode type device of this invention.

Figure 2:
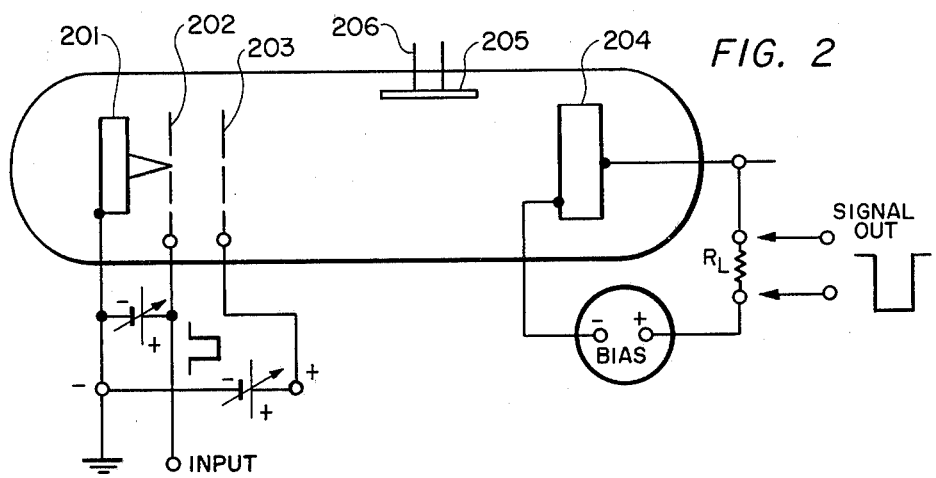
FIG. 2 illustrates a cold cathode EBS accoding to this invention.
Figure 3:
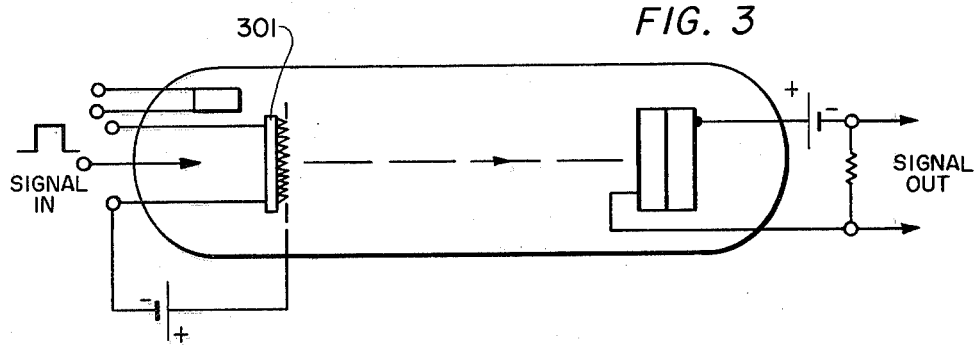
FIG. 3 illustrates a multi-tip cold cathode EBS according to this invention.

This invention is shown pictorially in FIG. 3 and schematically in FIG. 2. As mentioned, cold cathode (201) replaces the conventional hot cathode emitter of the conventional design. The fabrication of this semiconductor component shown pictorially in FIG. 3, will later be discussed in greater detail. To be noted here is that the cold cathode 201 and grid, or grids as desired (202,203), are fabricated together as one piece using solid state technology.

The target EBIT device 204, is reversed biased in the usual way (as is ) the grid 202, the accelerating anode 203 is forward biased approximately 10 KV. A signal for amplification purposes is applied at the first grid, though it might even be applied at the cathode with good result as has been discovered. The presence and number of grids is entirely optional; the invention may function with several grids and an accelerating anode though in practice a combination of one grid and accelerating anode has been found to be the most versatile. The significant function of the grid amongst other functions, is to direct as well as to modulate the emitted particle beam down a center path toward the EBIT target. The function of the anode is to accelerate the beam. The cathode here might be a field emitter as known, and the invention would be similarly operated.

In this invention, getters produced by the Saes Getter Co. of Milano, Italy have been identified and selected for use, represented pictorially at 205. These type getters do not explode in a vacuum or upon activation as do the standard getters. As is known, all getters must be heated to an activation temperature in some fashion; here it is done by passage of electrical current at 206. Two electrical wire prongs are mounted in the tubes' walls where getter material may be mounted and a current may be passed from outside the tube to activate this material. One activated, the getter functions independently as a vacuum "sponge" figuratively speaking, and helps maintain the vacuum within. As mentioned earlier, these getters will not explode, evaporate, or degass so as to poison the cathode tips and adjacent structural elements. One type material used for Saes Getters is identified as zirconium, a good gettering material.

Maintaining the spacing between grids and cathode is of course crucial to beam optics. For this reason, in selecting materials different heat expansion rated materials and different materials in general are to be avoided. Ideally, all the structural elements should have the same expansion rates and thermal characteristics to maintain proper beam optics.

In regard to choice of materials for construction of the cold cathode EBS device the following factors are to be considered amongst others. First, materials must be selected of those known to be least likely to degass. This is true even though all materials will additionally be prefired to remove volatile surface matter therefrom. For the interior walls, such materials as the high purity ceramics, $Al_2O_3$-99.5%, Lucalox 99.99, or pure sapphire $Al_2O_3$-100% might be chosen for resistance to degassing. An all ceramic envelope is used in one embodiment. Another factor however, is that the material must not be fragile for breakage purposes in general, and for rapid expansion in particular, so that glass, for instance, is not advisable. Another factor is having material capable of withstanding temperatures in the prefiring technique of this invention; the envelope is prefired to some 1000°, as in a RF vacuum furnance for instance. In this connection, it is well to mention that the EBIT or the cathode cannot withstand more than 250° C., e.g., without destruction so that it is is not mounted in the envelope during this prefiring. By way of contrast, prefiring the study envelope which might be ceramic for instance, tends to make it cleaner for high vacuum device application. A primary consideration in selection of materials is that they be as poor of a gas absorber, adsorber, or desorber as is possible to obtain. In this regard, molybdenum, nickel and tungsten are good materials for the grids, cathodes, and wiring within. However, other considerations might affect making this choice. Tungsten is too hard and brittle, ideally the material must be easily machined, shaped and formed into the desired shape and not break easily. As mentioned earlier, to maintain proper spacing between components it is wise to choose materials throughout with similar expansion and physical properties.

The grid material, naturally, would have to be a good high vacuum material which would be as passive as possible, neither absorbing or desorbing gasses well. Titanium would be a poor choice in this regard because its getters (absorbs) too well.

Cathode emitter materials are best selected at a low threshold voltage characteristic of 200 volts. Some of the materials chosen are $HO_2$-W, Si $O_2$-MO, or $S_nO_2$, which have been determined to be able to meet all the above qualifications, withstand the high electrical fields for this application without arcing due to thermally generated causes, outgassing, evaporation or leakage, and useable for such low thresholds (a Tungsten field emitter by contrast, would require some 10,000 volts threshold). It is noted that certain types of cold cathodes are available from various commercial sources, ready made.

The getter material would have to be, as mentioned above, an excellent gas absorber. Typically, a getter is zirconium-aluminum alloy, preactivated to a certain temperature in the vacuum, 700° C. for instance, until activated it may not absorb. As mentioned earlier Saes Co. getters have been found not to explode in a vacuum and are additionally considered a good getter choice.

The cathode-grid structure is shown pictorially in FIG. 3 as 301. It is made of tin oxide; e.g., in one embodiment.

Figure 4:
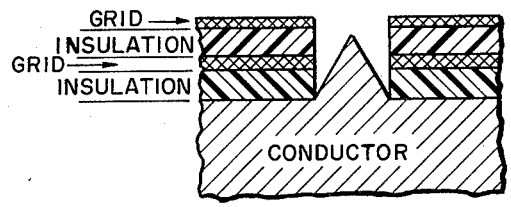
FIG. 4 illustrates fabrication of cold cathode tips in relation to this invention.

As shown in FIG. 4, the cathode types and grids are formed physically in a deposition process providing alternate layers of conductor and insulator materials and using various etchings steps. The full process, in one embodiment, is given further below.

While the cathode has been shown as some 50 tips in a circular arrangement, this is entirely variable. They might be arranged in a symmetrical geometrical pattern with EBIT strips symmetrical corresponding to the pattern of the cathode tips. Numerous modifications to the cathode, grid and target geometrical shape might be made within the scope of the invention. In an article entitled "Physical Properties of Thin-Film Field Emission Cathodes with Molybdenum Cones", in the Journal of Applied Physics, December 1976, aspects of cold cathode fabrication technology are discussed on page 5250 there and the authors describe some of the breakdown conditions above mentioned. The suggestion for avoiding this is by a more stringent vacuum, and provision of a separate filament, but not by a choice of structural materials as suggested by this invention, $UO_2$-W and $SiO_2$-W particularly not mentioned there.

Certain patents to Spindt et al., U.S. Pat. Nos. 3,755,705; 3,789,471 and 3,812,599, and a patent to Smith, U.S. Pat. No. 4,149,308, describe cold cathode structures and fabrication techniques. In them, the authors describe a method of growing a semiconductor array of cones to be used as cold cathodes. Their method and structure, however, ends with fabricating the cathode and not with constructing of a cold cathode vacuum tube as in this invention.

In a patent to Cook et al., U.S. Pat. No. 4,123,798 there is described a memory device consisting of a cold cathode used to bombard a target memory in vacuum. Cook et al. describe one of the problems of cold cathodes, i.e., their rapid failure in these situations, and discuss the necessity of perfecting field emission or negative-electron affinity type of cathodes for extended life. Cook et al. do not show the aspects of this invention; i.e., an EBIT target bombarded by a cold cathode source for amplificatin. Cook et al. did not disclose the cold cathode of this invention which would have had the extended life mentioned. The only suggest the need for making such advances, but do not solve them as done in this invention.

GROWTH OF $UO_2$-W FIELD EMITTERS

According to methods published by the Georgia Tech Staff, composites consisting of an oxide matrix containing millions of less than 1-$\mu$m diameter metal fibers per $cm^2$, may be grown from near eutectic compositions using a direct rf-heating internal floating zone technique. Very uniform composites are produced because of the well-defined liquid-solid interface associated with the inherent steep temperature gradients.

The $UO_2$-W composites from which emitter structures were formed are fabricated by first dry mixing the desired proportions of high-purity oxide and metal powders. This mixture is pressed into a cylinder of desired diameter and length and sintered inside an inductively heated furnace by sequential heating to 1500° C. in an $N_2$ and/or $CO/CO_2$ atmosphere.

Unidirectional solidification is achieved by moving the heating zone of rods through the furnace hot zone at 2-4 cm/h. By this method emitter arrays of better than 3000 tips per $cm^2$ have been fabricated.

After the $UO_2$-W composite trip array is fabricated, the wafer is polished to a 1 $\mu$m finish. The polished surface is then acid etched and after etching, the tungsten fibers are exposed. Next, an insulator ($SiO_2$ or $Al_2O_3$) is vapor deposited parallel to the tungsten pins' axis to a thickness of 1-3 $\mu$m. Deposition of the insulator is followed by deposition of a coating of moly or some other suitable metal to act as the extractor or grid.

While the invention has been described in relation to a particular embodiment it should be recognized by those skilled in the art that numerous modifications and substitutions may be made within the scope of the invention.

What is claimed is:

1. An electronic tube device comprising:
   an EBIT electron beam injected target means;
   a cold cathode emitting means comprising tungsten uranium oxide material, for bombarding said target means with electrons;
   grid means comprising molybdenum material, for modulating said electrons including means for directing said electrons toward said target means further, including means for electrically biasing said modulating and directing means;
   sealed tube means comprising sapphire ceramic material for completely enclosing said target means, emitting means, and means for modulating and directing, in a vacuum of $10^{-7}$ to $10^{-8}$ Torr, further including a getter means specifically used for maintaining said vacuum; and
   means for conducting input electrical signals into, and output electrical signals from, the said electronic tube device, whereby amplification of said input electrical signals may be accomplished by use of the said electronic tube device.

2. The device of claim 1 wherein the said emitting means comprises material from the group of:
   $SiO_2$—Mo, or $SnO_2$.

3. The device of claim 1 wherein the said means for modulating and means for directing comprises material from the group of: molybdenum, nickel, or tungsten.

4. The device of claim 1 wherein the said tube means for enclosing comprises prefired material from the group of: Al 99.5, Lucalox 99.99, Molybdenum, or Kovar.

* * * * *